US012617692B2

(12) United States Patent
Sato et al.

(10) Patent No.: US 12,617,692 B2
(45) Date of Patent: May 5, 2026

(54) FILM-FORMING MATERIAL

(71) Applicant: Mitsui Kinzoku Company, Limited, Tokyo (JP)

(72) Inventors: Ryuichi Sato, Omuta (JP); Naoki Fukagawa, Omuta (JP); Yuji Shigeyoshi, Omuta (JP); Kento Matsukura, Omuta (JP)

(73) Assignee: MITSUI KINZOKU COMPANY, LIMITED, Tokyo (JP)

( * ) Notice: Subject to any disclaimer, the term of this patent is extended or adjusted under 35 U.S.C. 154(b) by 0 days.

(21) Appl. No.: 18/238,066

(22) Filed: Aug. 25, 2023

(65) Prior Publication Data

US 2023/0406719 A1 Dec. 21, 2023

Related U.S. Application Data

(60) Division of application No. 17/856,430, filed on Jul. 1, 2022, now abandoned, which is a division of
(Continued)

(30) Foreign Application Priority Data

Dec. 28, 2015 (JP) ................................. 2015-255974

(51) Int. Cl.
  *C01F 17/218* (2020.01)
  *C01F 17/265* (2020.01)
  (Continued)

(52) U.S. Cl.
  CPC .......... *C01F 17/218* (2020.01); *C01F 17/265* (2020.01); *C23C 4/04* (2013.01);
  (Continued)

(58) Field of Classification Search
  CPC ........ C01F 17/218; C01F 17/265; C23C 4/04; C23C 4/12; C23C 14/06; C01P 2002/72; C01P 2002/74; C01P 2004/62
  See application file for complete search history.

(56) References Cited

U.S. PATENT DOCUMENTS 9,388,485 B2 7/2016 Fukagawa et al.
9,708,187 B2 7/2017 Fukagawa et al.
(Continued)

FOREIGN PATENT DOCUMENTS

CN     104701125 A   6/2015
JP     2000-239067 A  9/2000
(Continued)

OTHER PUBLICATIONS

Ali, Asif, Yi Wai Chiang, and Rafael M. Santos. "X-ray diffraction techniques for mineral characterization: A review for engineers of the fundamentals, applications, and research directions." Minerals 12.2 (2022): 205. (Year: 2020).*
(Continued)

*Primary Examiner* — Cameron K Miller
(74) *Attorney, Agent, or Firm* — Birch, Stewart, Kolasch & Birch, LLP

(57) ABSTRACT

A film-forming material of the present invention contains an oxyfluoride of yttrium represented by $YO_X F_Y$ (X and Y are numbers satisfying $0<X$ and $X<Y$) and $YF_3$, wherein a ratio $I_2/I_1$ of a peak height $I_2$ of the (020) plane of $YF_3$ to a peak height $I_1$ of the main peak of $YO_X F_Y$ as analyzed by XRD is from 0.005 to 100. It is preferable that a ratio $I_4/I_1$ of a peak height $I_4$ of the main peak of $Y_2O_3$ to the peak height $I_1$ of the main peak of $YO_X F_Y$ as analyzed by XRD is 0.01 or less.

14 Claims, 1 Drawing Sheet

Main peak of $Y_5O_4F_7$

Example 5

Peak of (020) plane of $YF_3$ $2\theta$ (° )

Related U.S. Application Data application No. 17/060,442, filed on Oct. 1, 2020, now abandoned, which is a continuation of application No. 16/061,242, filed as application No. PCT/JP2016/087364 on Dec. 15, 2016, now Pat. No. 10,934,174.

(51) Int. Cl.

| | |
|---|---|
| *C23C 4/04* | (2006.01) |
| *C23C 4/12* | (2016.01) |
| *C23C 14/06* | (2006.01) |
| *C23C 14/48* | (2006.01) |
| *C23C 24/04* | (2006.01) |

(52) U.S. Cl.
CPC ................ *C23C 4/12* (2013.01); *C23C 14/06* (2013.01); *C23C 14/48* (2013.01); *C23C 24/04* (2013.01); *C01P 2002/72* (2013.01); *C01P 2002/74* (2013.01); *C01P 2004/61* (2013.01); *C01P 2004/62* (2013.01)

(56) References Cited

U.S. PATENT DOCUMENTS

| | | |
|---|---|---|
| 10,538,836 B2 | 1/2020 | Takai et al. |
| 2005/0282034 A1 | 12/2005 | Hayasaki et al. |
| 2007/0111030 A1 | 5/2007 | Nakano et al. |
| 2008/0292890 A1 | 11/2008 | Hayasaki et al. |
| 2010/0129670 A1 | 5/2010 | Sun et al. |
| 2014/0057078 A1 | 2/2014 | Hamaya et al. |
| 2015/0096462 A1 | 4/2015 | Fukagawa et al. |
| 2015/0111037 A1 | 4/2015 | Fukagawa et al. |
| 2015/0307715 A1 | 10/2015 | Sato et al. |
| 2016/0244868 A1* | 8/2016 | Ibe ........................ C04B 35/553 |
| 2016/0326058 A1 | 11/2016 | Nagayama et al. |
| 2016/0326059 A1 | 11/2016 | Nagayama et al. |
| 2016/0326623 A1 | 11/2016 | Nagayama et al. |
| 2017/0088930 A1* | 3/2017 | Ibe ........................... C09D 7/61 |
| 2017/0114440 A1* | 4/2017 | Takai ................ H01J 37/32495 |
| 2017/0342539 A1 | 11/2017 | Sato et al. |
| 2018/0362359 A1 | 12/2018 | Sato et al. |
| 2019/0264316 A1 | 8/2019 | Takai et al. |
| 2019/0264317 A1 | 8/2019 | Takai et al. |

FOREIGN PATENT DOCUMENTS

| | | |
|---|---|---|
| JP | 2005-240171 A | 9/2005 |
| JP | 2007-138288 A | 6/2007 |
| JP | 2012-506664 A | 4/2012 |
| JP | 2014-040634 A | 3/2014 |
| JP | 2016-211070 A | 12/2016 |
| JP | 2017-61737 A | 3/2017 |
| JP | 2017-62325 A | 5/2017 |
| WO | WO 2014/002580 A1 | 1/2014 |
| WO | WO 2014/112171 A1 | 7/2014 |
| WO | WO 2015/019673 A1 | 2/2015 |

OTHER PUBLICATIONS

International Search Report for PCT/JP2016/087364 (PCT/ISA/210) mailed on Feb. 28, 2017.

* cited by examiner

FILM-FORMING MATERIAL

CROSS-REFERENCE TO RELATED APPLICATIONS

This application is a Divisional application of co-pending application Ser. No. 17/856,430, filed on Jul. 1, 2022, which is a Divisional application of application Ser. No. 17/060, 442, filed on Oct. 1, 2020, which is a Continuation application of application Ser. No. 16/061,242 (U.S. Pat. No. 10,934,174), filed on Jun. 18, 2018, which is the National Phase under 35 U.S.C. § 371 of International Application No. PCT/JP2016/087364, filed on Dec. 15, 2016, which claims the benefit under 35 U.S.C. § 119(a) to Patent Application No. 2015-255974, filed in Japan on Dec. 28, 2015, all of which are hereby expressly incorporated by reference into the present application.

TECHNICAL FIELD

The present invention relates to a film-forming material containing an oxyfluoride of yttrium represented by $YO_XF_Y$ (X and Y are numbers satisfying 0<X and X<Y).

BACKGROUND ART

In the fabrication of semiconductor devices, there are cases where a halogen-based gas, such as a fluorine-based gas or a chlorine-based gas, is used in an etching step, such as plasma etching. In order to prevent corrosion of an etching apparatus due to the halogen-based gas, generally, the inner side of the etching apparatus is coated with a highly anti-corrosive substance. Materials containing a rare earth element, typically, yttrium are often used as one type of such substances.

Patent Document 1 discloses a thermal spray material composed of granules containing an oxyfluoride (LnOF) of a rare earth element. This document states that "The oxyfluoride (LnOF) of a rare earth element (Ln) is a compound composed of the rare earth element (Ln), oxygen (O), and fluorine (F). The LnOF may be a compound having a molar ratio among the rare earth element (Ln), oxygen (O), and fluorine (F) of Ln:O:F=1:1:1. Also, the LnOF may be a compound having an Ln:O:F molar ratio other than Ln:O:F=1:1:1. For example, when Ln is Y, the LnOF include $Y_5O_4F_7$, $Y_7O_6F_9$, and the like as well as YOF, and may be a single compound or a mixture of two or more of such oxyfluorides." This document states that the thermal spray material may also contain a fluoride $LnF_3$ of a rare earth element in addition to the LnOF.

CITATION LIST

Patent Literature

Patent Literature 1: US 2015111037(A1)

SUMMARY OF INVENTION

However, the yttrium oxyfluoride produced in the examples of Patent Document 1 is actually a compound having a molar ratio among yttrium (Y), oxygen (O), and fluorine (F) of Ln:O:F=1:1:1, that is, YOF, and a thermal spray material using a compound represented by $YO_XF_Y$ (X and Y are numbers satisfying 0<X and X<Y) as yttrium oxyfluoride (hereinafter also simply referred to as $YO_XF_Y$) is not produced in the examples of this document. Moreover, in this document, formation of a film using a thermal spray material containing $YO_XF_Y$ and evaluation of the film are not performed. Also, this document makes no mention whatsoever of a combination of $YO_XF_Y$ and $YF_3$. Furthermore, the demand for improvement in corrosion resistance of film-forming materials against halogen-based plasma has recently been becoming more and more severe, and in terms of the corrosion resistance, the thermal spray material using the YOF produced in Patent Document 1 leaves room for improvement. However, film-forming materials containing only $YO_XF_Y$ also leave room for improvement in terms of the above-described corrosion resistance.

The present invention provides a film-forming material that can eliminate various drawbacks of related art described above.

The inventors of the present invention have surprisingly found that a mixture of an yttrium oxyfluoride represented by $YO_XF_Y$ and $YF_3$ exhibits a high deposition rate when used as a film-forming material, and the resultant film has a high corrosion resistance against plasma using a halogen-based gas, namely either a fluorine-based gas or a chlorine-based gas, and have thus accomplished the present invention.

This invention provides a film-forming material including: an yttrium oxyfluoride represented by $YO_XF_Y$ (X and Y are numbers satisfying 0<X and X<Y) and $YF_3$, wherein a ratio $I_2/I_1$ of a peak height $I_2$ of the (020) plane of the $YF_3$ to a height $I_1$ of a main peak of the $YO_XF_Y$ as analyzed by XRD is from 0.005 to 100.

BRIEF DESCRIPTION OF DRAWINGS

The FIGURE is a chart showing the results of powder X-ray diffractometry of a film-forming material of Example 5.

DESCRIPTION OF EMBODIMENTS

In the following description, a film-forming material of the present invention (hereinafter, also referred to simply as "material of the present invention") will be described based on a preferred embodiment thereof.

One of the features of the film-forming material of the present invention is that the film-forming material contains a combination of an oxyfluoride of yttrium represented by $YO_XF_Y$ and a fluoride ($YF_3$) of yttrium. Thus, the film-forming material of the present invention exhibits a high deposition rate, and the resultant film has a high corrosion resistance against plasma using a halogen-based gas, namely either a fluorine-based gas or a chlorine-based gas. Note that "$YO_XF_Y$" is a formula that represents the amount-of-substance ratio among the individual elements, yttrium (Y), oxygen (O), and fluorine (F) constituting the oxyfluoride of yttrium, where the amount of substance of yttrium is taken as 1, and has the same meaning as a composition formula except that the amount-of-substance ratio is not expressed as an integer ratio.

$YO_XF_Y$ of the present invention is a compound composed of yttrium (Y), oxygen (O), and fluorine (F), with the number of moles of fluorine in the compound being greater than the number of moles of oxygen in the compound. From the standpoint of increasing the effects of the present invention, X is within a range of preferably 0.4≤X≤1.4, more preferably 0.4≤X≤1.2, even more preferably 0.4≤X≤1.0, and yet more preferably 0.6≤X≤1.0. From the same standpoint, on the condition that X<Y, Y in $YO_XF_Y$ is within a range of preferably 0.6≤Y≤1.8 and more preferably 0.8≤Y≤1.6. Moreover, Y/X, which is the ratio of Y to X, is within a range of preferably $1.01 \leq Y/X \leq 2.0$ and more preferably $1.05 \leq Y/X \leq 1.9$. Typical examples of $YO_XF_Y$ include $Y_5O_4F_7$, $Y_5O_6F_7$, $Y_7O_6F_9$, $Y_{17}O_{14}F_{23}$, and $(YO_{0.826}F_{0.17})F_{1.174}$. These compounds can be used alone or in combination of two or more. In particular, from the standpoint of increasing the effects of the present invention, it is preferable that $YO_XF_Y$ is $Y_5O_4F_7$. In the present invention, a film containing $YO_XF_Y$ can be formed by using the material of the present invention containing, as an essential component, $YO_XF_Y$ having fluorine (F) in a larger amount than oxygen (O) as the oxyfluoride of yttrium. $YO_XF_Y$ is a compound having fluorine (F) in a larger amount than oxygen (O), and is therefore even more highly resistant to halogen-based plasma than, for example, YOF, which contains oxygen (O) and fluorine (F) in a ratio of 1:1. For this reason, it is considered that the use of the film-forming material containing $YO_XF_Y$ makes it possible to increase the corrosion resistance of the resultant film against halogen-based plasma when compared with the case where a film-forming material containing, instead of $YO_XF_Y$, YOF as the oxyfluoride of yttrium is used.

However, actually, it has become clear that if a film is formed from a film-forming material containing only $YO_XF_Y$, the film leaves room for improvement in the corrosion resistance against halogen-based plasma. As a result of in-depth research on this issue, the inventor of the present invention has found that, compared with a film-forming material containing only $YO_XF_Y$, a film-forming material containing $YF_3$ in addition to $YO_XF_Y$ makes it possible to significantly improve the corrosion resistance of the resultant film against halogen-based plasma. The inventor of the present invention supposes the reason for this is that the material of the present invention contains $YF_3$ in addition to $YO_XF_Y$, thereby enabling suppression of the generation of a phase containing oxygen in a relatively large amount, such as YOF and $Y_2O_3$, in the resultant film, and consequently enabling $YO_XF_Y$, which has a higher corrosion resistance against halogen-based plasma than such phases, to be more stably generated.

In order for the material of the present invention to achieve the effect of containing the fluoride $(YF_3)$ of yttrium, it is necessary that the amount of $YF_3$ relative to $YO_XF_Y$ is within a certain range.

In the present invention, the $YF_3$ content in the film-forming material is defined based on the value of the relative intensity of the peak of the (020) plane of $YF_3$ with respect to the main peak of $YO_XF_Y$ as determined by X-ray diffractometry of particles contained in the film-forming material. "Main peak" refers to a peak with the maximum intensity (cps). Note that since the main peak of $YF_3$ is next to the main peak $YO_XF_Y$, the peak of the (020) plane was used as an indicator for $YF_3$. The aforementioned relative intensity of a peak refers to a peak height ratio. Specifically, when the material of the present invention is analyzed by X-ray diffractometry, the ratio $I_2/I_1$ of the peak height $I_2$ of the peak of the (020) plane of $YF_3$ to the peak height $I_1$ of the main peak of $YO_XF_Y$ is from 0.005 to 100. When $I_2/I_1$ is 0.005 or greater, the material of the present invention can achieve the above-described effect of containing $YF_3$. From the standpoint of increasing the effect of $YF_3$ being contained in the material, $I_2/I_1$ of the material of the present invention is preferably 0.006 or greater, more preferably 0.008 or greater, even more preferably 0.01 or greater, and yet more preferably 0.015 or greater. When $I_2/I_1$ is 100 or less, the material of the present invention has the advantage of being able to suppress the generation of a fluorine gas during film formation. From the standpoint of further increasing this effect, $I_2/I_1$ is preferably 95 or less, more preferably 90 or less, even more preferably 80 or less, and yet more preferably 70 or less. The aforementioned X-ray diffractometry is powder X-ray diffractometry that is performed in a scan range $2\theta$ of 10 to 90 degrees using $Cu$-$K\alpha$ or $Cu$-$K\alpha_1$ radiation as a radiation source. In order to obtain a film-forming material having $I_2/I_1$ within the above-described range, the film-forming material of the present invention can be produced using a production method that will be described later.

For example, in the case where $YO_XF_Y$ is $Y_5O_4F_7$, the main peak is usually observed at $2\theta=28.11$ degrees. In the case where $YO_XF_Y$ is $Y_6O_5F_8$, the main peak is usually observed at $2\theta=28.14$ degrees. In the case where $YO_XF_Y$ is $Y_7O_6F_9$, the main peak is usually observed at $2\theta=28.14$ degrees. The peak of the (020) plane of $YF_3$ is usually observed at $2\theta=25.9$ to 26.1 degrees, and particularly typically observed at $2\theta=26.03$ degrees.

From the standpoint of suppressing the generation of a phase, such as YOF and $Y_2O_3$, containing oxygen in a relatively large amount in the resultant film and also from the standpoint of making it unlikely for the resultant film to crack, it is preferable that the film-forming material of the present invention does not contain YOF. From these standpoints, it is more preferable that the film-forming material of the present invention contains only $YO_XF_Y$ as the oxyfluoride of yttrium. The phrase "the film-forming material does not contain YOF" means that no diffraction peak of YOF is observed when the film-forming material is analyzed by powder XRD that is performed in a scan range $2\theta$ of 10 to 90 degrees using $Cu$-$K\alpha$ or $Cu$-$K\alpha_1$ radiation as the radiation source. Moreover, from the above-described standpoint, it is also preferable that, when analyzed by powder XRD using the above-described radiation source and scan range, the ratio $I_3/I_1$ of the peak height $I_3$ of the main peak of YOF to the peak height $I_1$ of the main peak of $YO_XF_Y$ is less than 0.005.

In order to obtain a film-forming material of the present invention that does not contain YOF, the grinding conditions in Step 1 of the method for producing a film-forming material, which will be described later, can be adjusted.

Although it is preferable that the film-forming material of the present invention does not contain YOF as described above, the film-forming material may optionally contain YOF without impairing the effects of the present invention. If the film-forming material of the present invention further contains YOF, the main peak of YOF is observed at a position at $2\theta=28.72$ degrees when the film-forming material is analyzed by powder XRD in the above-described scan range using $Cu$-$K\alpha$ or $Cu$-$K\alpha_1$ radiation as the radiation source. In the case where the film-forming material of the present invention contains YOF, it is preferable that, when analyzed by XRD using the above-described radiation source and the above-described scan range, the ratio $I_3/I_1$ of the peak height $I_3$ of the main peak of YOF to the peak height $I_1$ of the main peak of $YO_XF_Y$ is from 0.005 to 0.5. Having $I_3/I_1$ of 0.005 or greater is preferable in that, for example, a wider choice of options regarding the production conditions can be provided while achieving the effects of the present invention to a certain extent. Also, having $I_3/I_1$ of 0.5 or less is preferable from the standpoint of suppressing the generation of a phase containing oxygen in a large amount in the resultant film. From these standpoints, $I_3/I_1$ is preferably from 0.006 to 0.45, more preferably from 0.007 to 0.4, and even more preferably from 0.009 to 0.35. In order to obtain a film-forming material of the present invention containing YOF and having $I_3/I_1$ within the above-described range, the grinding conditions in Step 1 of the method for producing a film-forming material, which will be described later, can be adjusted.

The film-forming material of the present invention contains $YO_xF_y$, and therefore contains oxygen. It is preferable that the amount of oxygen contained in the film-forming material is from 0.5 to 11.0 mass %. Setting the oxygen content in the film-forming material at 0.5 mass % or greater has the advantages of making it easy to obtain a smooth film and also increasing the toughness of the resultant film. On the other hand, setting the oxygen content at 11.0 mass % or less effectively prevents the generation of $Y_2O_3$, which is a substance that may cause a reduction in the corrosion resistance of the resultant film, in the film-forming material, thereby enabling effective prevention of a reduction in the corrosion resistance of the film. From these standpoints, the amount of oxygen contained in the film-forming material is more preferably from 0.7 to 10.8 mass % and even more preferably from 1.0 to 10.5 mass %. In order to set the amount of oxygen contained in the film-forming material within the above-described range, the film-forming material can be produced using the method for producing a film-forming material, which will be described later, for example.

The amount of oxygen contained in the film-forming material can be determined using, for example, an oxygen and nitrogen analyzer EMGA-920 manufactured by HORIBA, Ltd.

It is preferable that the material of the present invention contains no or minimum yttrium oxide ($Y_2O_3$), in light of the corrosion resistance of the resultant film against a halogen-based gas and plasma using the halogen-based gas, and in particular, the corrosion resistance against a fluorine-based gas and plasma using the fluorine-based gas. In order to minimize the amount of $Y_2O_3$ contained in the material of the present invention, for example, the amount of $Y_2O_3$ used in Step 1 of the method for producing the material of the present invention, which will be described later, can be appropriately set.

For example, it is preferable that, when the material of the present invention is analyzed by X-ray diffractometry using Cu-K$\alpha$ or Cu-K$\alpha_1$ radiation, the ratio $I_4/I_1$ of the peak height $I_4$ of the main peak of $Y_2O_3$ to the peak height $I_1$ of the main peak of $YO_xF_y$ observed in $2\theta=10$ to 90 degrees is 0.01 or less. "Intensity ratio" as used herein refers to a peak height ratio. In the present invention, $I_4/I_1$ is preferably 0.005 or less, more preferably 0.003 or less, and even more preferably 0.001 or less. The smaller the $I_4/I_1$, the better, and thus, it is most preferable that $I_4/I_1$ is 0, that is, no peak of $Y_2O_3$ is observed. In the present invention, when $I_4/I_1$ is as small as 0.01 or less, a film having a high corrosion resistance against halogen-based plasma can be obtained using the material of the present invention. In order to set $I_4/I_1$ of the film-forming material within the above-described range, the film-forming material can be produced using the method for producing a film-forming material, which will be described later, for example. The main peak derived from $Y_2O_3$ is usually observed in the vicinity of $2\theta=29.1$ degrees.

The film-forming material of the present invention may be in powder form, granular form, slurry form, shaped form, sintered form, cluster form, and the like.

First, the material of the present invention in powder form will be described in detail.

Film-Forming Material in Powder Form

In the present invention, the film-forming material in powder form is usually powder containing $YO_xF_y$ and $YF_3$. It is preferable that the average particle size $D_{50}$ of this powder is from 0.1 to 10 μm. In the present invention, setting the average particle size $D_{50}$ of the powder at 0.1 μm or greater makes it easy to obtain a dense and uniform film, and is therefore preferable. Also, setting the average particle size $D_{50}$ of the powder at 10 μm or less makes it possible to obtain a dense film that is unlikely to crack, and is therefore preferable. From these points of view, the average particle size $D_{50}$ of the powder containing $YO_xF_y$ and $YF_3$ is more preferably from 0.2 to 9 μm and even more preferably from 0.3 to 8 μm. In the present invention, the average particle size $D_{50}$ of the powder containing $YO_xF_y$ and $YF_3$ refers to the diameter at 50% of the cumulative volume fraction. The powder containing $YO_xF_y$ and $YF_3$ may or may not contain particles that each contain $YO_xF_y$ and $YF_3$. The powder containing $YO_xF_y$ and $YF_3$ may be a collection of particles that each contain $YO_xF_y$ and $YF_3$, or may be a mixture of particles that each contain $YO_xF_y$ but not $YF_3$ and particles that each contain $YF_3$ but not $YO_xF_y$ (the same applies to powder containing $YO_xF_y$ and $YF_3$ contained in the film-forming material in slurry form, which will be described later).

$D_{50}$ can be determined by laser diffraction/scattering particle size distribution analysis. Specifically, $D_{50}$ can be determined using a method that will be described later (the same applies hereinafter). During determination by laser diffraction/scattering particle size distribution analysis, the average particle size $D_{50}$ of the powder is determined without performing ultrasonic dispersion. In order to set the average particle size of the particles within this range, appropriate grinding conditions can be set in a method for producing a film-forming material in powder form, which will be described later.

Film-Forming Material in Granular Form

In the present invention, the film-forming material in granular form is usually granules containing $YO_xF_y$ and $YF_3$. The film-forming material in granular form is preferably composed of granules containing $YO_xF_y$ and $YF_3$, and may be composed of only granules containing $YO_xF_y$ and $YF_3$. However, the film-forming material in granular form may also contain other types of powder, if necessary. For example, the film-forming material in granular form may also have particles in a form other than granular form. An example of the particles in a form other than granular form is particles formed by granules being partially ground into particles that are finer than the granules. In the case where the film-forming material in granular form has granules and particles in a form other than granular form, the granules and the particles in the form other than granular form generally have the same composition. "Granules" as used in the present invention refers to aggregates of primary particles. As for the particle size of the primary particles, the average particle size $D_{50}\alpha$ of particles after grinding in Step 3 of a method for producing a film-forming material in granular form, which will be described later, may be used. The granules are granulated particles that are produced by spray drying or the like, and are different from non-granulated particles. Note that "granules" as used herein may refer to a collection of a plurality types of granules or may refer to a single type of granules. Therefore, "granules containing $YO_xF_y$ and $YF_3$" as used herein does not necessarily mean granules that each contain both $YO_xF_y$ and $YF_3$, but naturally includes a case where a collection of granules contains $YO_xF_y$ and $YF_3$ even though the granules do not each contain both $YO_xF_y$ and $YF_3$. However, preferably, the granules of the film-forming material of the present invention in granular form each contain both $YO_xF_y$ and $YF_3$. Granules that each contain both $YO_xF_y$ and $YF_3$ may or may not contain, as the primary particles, particles that each contain both $YO_XF_Y$ and $YF_3$. Granules that each contain both $YO_XF_Y$ and $YF_3$ may be, for example, a collection of primary particles that each contain both $YO_XF_Y$ and $YF_3$, or may be a collection of primary particles that each contain $YO_XF_Y$ but not $YF_3$ and primary particles that each contain $YF_3$ but not $YO_XF_Y$.

It is preferable that the average particle size $D_{50}$ of the film-forming material in granular form when determined without ultrasonic dispersion is greater than 10 µm and not greater than 100 µm. When $D_{50}$ of the film-forming material in granular form is greater than 10 µm, the granules have favorable flowability and thus can be stably supplied to a film-forming apparatus. Also, when $D_{50}$ is not greater than 100 µm, the film-forming material is easily melted, aerosolized, and ionized during film formation, making it easy to form a uniform film. From these points of view, $D_{50}$ is more preferably from 15 to 90 µm and even more preferably from 20 to 80 µm. In order to set $D_{50}$ within the above-described range, the grinding conditions in Step 1, the granulation conditions in Step 4, and the like of a method for producing a film-forming material in granular form, which will be described later, can be adjusted.

The shape of the granules is not limited. In the case where granules are produced by spray drying, which will be described later, generally, the shape of the produced granules is substantially spherical.

Film-Forming Material in Slurry Form

The film-forming material of the present invention may also be in the form of a slurry that contains powder containing $YO_XF_Y$ and $YF_3$. The film-forming material in this case is also called "film-forming slurry". In the case where the film-forming material of the present invention is in slurry form, the above-described $D_{50}$ can be determined using powder in the slurry state. A preferable range of $D_{50}$ of the film-forming material in slurry form is the same as the range that has been described above as a preferable range for the film-forming material in powder form.

Water and various organic solvents can be used alone or in combination of two or more as a dispersion medium of the film-forming material in slurry form. Among these, an organic solvent having a solubility in water of 5 mass % or greater or a mixture of such an organic solvent and water is preferably used because an even more dense and uniform film can be easily obtained. Here, the organic solvent having a solubility in water of 5 mass % or greater includes an organic solvent that is freely miscible with water. Moreover, with regard to the mixture of the organic solvent having a solubility in water of 5 mass % or greater and water, it is preferable that the mixing ratio of the organic solvent and water falls within the limits of the solubility of the organic solvent in water. In light of the dispersibility of particles having $YO_XF_Y$, the percentage of the organic solvent having a solubility in water of 5 mass % or greater in the dispersion medium is preferably 5 mass % or greater, more preferably 10 mass % or greater, and even more preferably 12 mass % or greater.

Examples of the organic solvent (also including the organic solvent that is freely miscible with water) having a solubility in water of 5 mass % or greater include an alcohol, a ketone, a cyclic ether, a formamide, a sulfoxide, and the like.

Examples of the alcohol that can be used in the present invention include monohydric alcohols such as methanol (methyl alcohol), ethanol (ethyl alcohol), 1-propanol (n-propyl alcohol), 2-propanol (iso-propyl alcohol, IPA), 2-methyl-1-propanol (iso-butyl alcohol), 2-methyl-2-propanol (tert-butyl alcohol), 1-butanol (n-butyl alcohol), and 2-butanol (sec-butyl alcohol) as well as polyhydric alcohols such as 1,2-ethanediol (ethylene glycol), 1,2-propanediol (propylene glycol), 1,3-propanediol (trimethylene glycol), and 1,2,3-propanetriol (glycerol).

Examples of the ketone that can be used in the present invention include propanone (acetone), 2-butanone (methyl ethyl ketone, MEK), and the like. Examples of the cyclic ether include tetrahydrofuran (THF), 1,4-dioxane, and the like. Examples of the formamide include N,N-dimethylformamide (DMF) and the like. Examples of the sulfoxide include dimethyl sulfoxide (DMSO) and the like. These organic solvents can be used alone or as a mixture of two or more.

Among these, an alcohol is preferable as the organic solvent having a solubility in water of 5 mass % or greater, a monohydric alcohol is more preferable, and at least one organic solvent selected from methanol, ethanol, 1-propanol, and 2-propanol is even more preferable.

Note that in the case where a mixture of water and ethanol is used as the dispersion medium, it is preferable that the percentage of ethanol is 24 vol % (20 mass %) or less because the mixture is then exempt from the United Nations regulations on the transport (UN No. 1170).

The percentage of the powder containing $YO_XF_Y$ and $YF_3$ contained in the film-forming material in slurry form is preferably from 10 to 50 mass %, more preferably from 12 to 45 mass %, and even more preferably from 15 to 40 mass %. Within this concentration range, the slurry can be deposited in a relatively short period of time, which results in a high deposition efficiency, and a film having favorable uniformity can be formed.

Furthermore, in addition to the powder containing $YO_XF_Y$ and $YF_3$ as well as the dispersion medium, other components such as a pH regulator, a dispersant, a viscosity modifier, and a bactericide can be used in the film-forming material in slurry form as appropriate without impairing the effects of the present invention. The film-forming material in slurry form may contain, as solid matter, the powder containing $YO_XF_Y$ and $YF_3$ and other powder, but from the standpoint of forming a dense and uniform film, it is preferable that the film-forming material contains only the powder containing $YO_XF_Y$ and $YF_3$ as the solid matter.

Film-Forming Material in Shaped Form

An example of the film-forming material in shaped form is a shaped body obtained by shaping a film-forming material in powder form or granular form into a predetermined shape by applying pressure to the film-forming material. The shape of the shaped body is not limited, and may be, for example, a circular cylinder, a rectangular, or the like.

Film-Forming Material in Sintered Form

An example of the film-forming material in sintered form is a sintered body obtained by shaping and firing a film-forming material in powder form or granular form. Examples of the shape of the sintered body may be the same as those of the shaped body.

Film-Forming Material in Cluster Form

An example of the film-forming material in cluster form is a non-shaped body having a larger particle size than granules and powder. Specifically, "clusters" as used in this specification have a size that is larger than powder and granules and that allows such clusters to be used in an ion plating method, and preferably have a particle size from 0.1 to 5 mm. "Particle size" as used herein refers to the longest line segment of all the line segments passing across the shape of a specific object when viewed from any one direction. A cluster is not a shaped body or a sintered body.

Film Formation Method

Next, a film formation method that can be used when forming a film using the material of the present invention will be described.

Examples of main film formation methods applicable to the present invention include a thermal spraying method, an aerosol deposition method (AD method), an ion plating method, and the like.

The film thickness is preferably from 50 to 300 μm in the case of the thermal spraying method, and is preferably from 3 to 20 μm in the case of the aerosol deposition method (AD method) or the ion plating method.

(1) Thermal Spraying Method

In the case where the material of the present invention is in powder form, granular form, or slurry form, the thermal spraying method is applicable as the film formation method. With regard to the method for thermal-spraying the film-forming material, flame spraying, high velocity flame spraying, detonation spraying, laser spraying, plasma spraying, combined laser-plasma spraying, and the like are applicable. Note that irrespective of whether the material of the present invention is in powder form, granular form, or slurry form, a uniform and dense thermal-sprayed film can be obtained by performing thermal spraying using the material of the present invention, and it is believed that this is because the material of the present invention is easy to uniformly melt during thermal spraying.

(2) Aerosol Deposition Method (AD Method)

In the case where the material of the present invention is in powder form or granular form, the material is also applicable to the aerosol deposition method (AD method) as the film formation method. Helium, argon, nitrogen, or the like can be used as a carrier gas for aerosolization. A dense and uniform film can be obtained by employing the material of the present invention for film formation using the AD method, and it is believed that this is because aerosolization of the material of the present invention in the AD method occurs uniformly.

(3) Ion Plating Method (IP Method)

In the case where the material of the present invention is in powder form, granular form, shaped form, sintered form, or cluster form, the material is also applicable to the ion plating method as the film formation method. The ion plating method is a type of so-called PVD (physical vapor deposition). In the ion plating method, the material of the present invention is evaporated or sublimed in vacuum, and the vapor reaches a workpiece and deposits thereon, thereby forming a film. Evaporated particles are passed through plasma and thereby positively charged. The workpiece is negatively charged to attract the evaporated particles and cause the particles to deposit thereon, and thus, a film is created. An inert gas such as argon, for example, is introduced into a chamber of a processing apparatus.

Hereinafter, preferred methods for producing the film-forming material of the present invention will be described. However, the film-forming material of the present invention is not limited to the production methods below.

Production Methods

(1) Method for Producing Film-Forming Material in Powder Form

A preferred method for producing the material of the present invention in powder form has Steps 1 to 3 as follows, which will be described in detail:

Step 1: Yttrium oxide ($Y_2O_3$) and yttrium fluoride ($YF_3$) in such respective amounts that the ratio (molar ratio $YF_3/Y_2O_3$) of the number of moles of $YF_3$ to 1 mol of $Y_2O_3$ is from 1.8 to 100 are ground and mixed to give a mixture that has been ground (hereinafter also referred to as "ground mixture"). If Step 1 is performed using a wet process, the mixture is obtained by drying the resultant slurry.

Step 2: The ground mixture obtained in Step 1 is fired to give a fired product in which $YO_XF_Y$ has been generated.

Step 3: The fired product obtained in Step 2 is ground. If Step 3 is performed using a wet process, the resultant wet-ground product is dried to give a dry product.

Step 1

The average particle size ($D_{50d}$) of $Y_2O_3$ to be mixed is preferably from 0.1 to 10 μm and more preferably from 0.5 to 8.0 μm. From the same point of view, the average particle size ($D_{50d}$) of $YF_3$ to be mixed is preferably from 0.1 to 10 μm and more preferably from 0.5 to 8.0 μm. These average particle sizes $D_{50d}$ are determined after ultrasonication, and specifically may be determined using the following method. Setting the average particle sizes ($D_{50d}$) of $Y_2O_3$ and $YF_3$ within the above-described respective ranges has the advantage of making it possible to ensure reactivity in firing in Step 2.

Method for Determining $D_{50d}$

About 0.4 g of film-forming material is put in a 100-mL glass beaker. Then, a 0.2 mass % aqueous solution of sodium hexametaphosphate serving as a dispersion medium is put in the beaker to the line of 100 mL. The beaker containing the particles and the dispersion medium is set on an ultrasonic homogenizer US-300T (output: 300 W) manufactured by Nihon Seiki Kaisha Ltd., and subjected to ultrasonication for 5 minutes to prepare a slurry for determination. The slurry for determination is dropped into a chamber, containing a 0.2 mass % aqueous solution of sodium hexametaphosphate, of a sample circulator of a Microtrac (registered trademark) HRA manufactured by Nikkiso Co., Ltd. until the instrument judges the concentration to be adequate, and $D_{50d}$ is determined.

In the present production method, setting the mixing ratio between $Y_2O_3$ and $YF_3$ within a specific range makes it possible to obtain a film-forming material that exhibits a high deposition rate and that forms a film having a high corrosion resistance against halogen-based plasma. Specifically, for the purpose of obtaining a film-forming material containing a specific amount of $YF_3$, it is important that the molar ratio $YF_3/Y_2O_3$ should be not less than the above-described lower limit. From the standpoint of securing the $YO_XF_Y$ content in the film-forming material and thereby increasing the effects of the present invention, it is important that the molar ratio $YF_3/Y_2O_3$ should be not greater than the above-described upper limit. From these points of view, the molar ratio $YF_3/Y_2O_3$ is preferably from 1.83 to 5.95, more preferably from 1.85 to 5.9, and even more preferably from 1.9 to 5.8.

In Step 1, it is important that the mixture containing $Y_2O_3$ and $YF_3$ should be ground with a high energy, and in this manner, a film-forming material of the present invention that has a high corrosion resistance against halogen-based plasma and exhibits a high deposition rate can be obtained. The inventor of the present invention considers that grinding the mixture, instead of simply mixing $Y_2O_3$ and $YF_3$, makes it possible for the oxyfluoridation reaction in Step 2 to uniformly proceed, and thus, the present production method causes $YO_XF_Y$ to be stably generated in the resultant film-forming material and enables suppression of the generation of a phase, such as YOF and $Y_2O_3$, containing oxygen in a relatively large amount. The inventor of the present invention infers that this, in turn, contributes to the effects provided by the resultant film-forming material. Note that, at the start of grinding, it is sufficient that the mixture containing $Y_2O_3$ and $YF_3$ contains $Y_2O_3$ and $YF_3$, and the degree of mixing (mixing state) does not matter.

Preferably, an organic solvent is used during mixing. If water is used as a solvent during mixing, generation of yttrium hydroxide easily proceeds in wet grinding of Step 1, which results in suppression of the oxidation of $Y_2O_3$, and consequently, a phase, such as YOF and $Y_2O_3$, containing oxygen in a relatively large amount is likely to be generated in the resultant film-forming material. However, use of water during the above-described mixing is permitted if the amount of water used is 50 parts by mass or less with respect to 100 parts by mass of the organic solvent. Those organic solvents that have been described above as examples of the dispersion medium of the film-forming material in slurry form can be used as the organic solvent. In particular, from the standpoint of suppressing agglomeration of particles during wet grinding, it is preferable to use the above-described organic solvents having a solubility in water of 5 mass % or greater. Among these, an alcohol is preferable, a monohydric alcohol is more preferable, and at least one organic solvent selected from methanol, ethanol, 1-propanol, and 2-propanol is even more preferable.

In the case where, as will be described later, wet grinding is performed to grind the mixture, the organic solvent can be used as a dispersion medium for wet grinding.

The grinding may be effected by performing dry grinding, wet grinding, or both dry grinding and wet grinding. In the case of dry grinding, a dry ball mill, a dry bead mill, a high-speed rotation impact mill, a jet mill, a stone-ground mill, a roll mill, a mortar machine, and the like can be used. Wet grinding is preferably performed using a wet grinding apparatus that employs a grinding medium having a spherical shape, a cylindrical shape, or the like. Examples of such grinding apparatus include a wet ball mill, a wet vibration mill, a wet bead mill, an Attriter (registered trademark), and the like. In particular, it is preferable to perform the grinding using a wet bead mill DYNO-MILL ECM-AP2, from the standpoint of increasing the above-described effects of the grinding during mixing. In the case where wet grinding is performed, it is preferable to prepare a slurry having a solid concentration from 20 to 60 mass % from a mixture containing $Y_2O_3$ and $YF_3$ using a dispersion medium and subject the prepared slurry to wet grinding. It is preferable that the average particle size $D_{50}\alpha$ of particles after grinding (hereinafter also referred to as "after mixing treatment") is from 1.0 to 4.0 μm. An average particle size $D_{50}\alpha$ of 4.0 μm or less makes it easy to achieve sufficient effects of the mixing by grinding, and is therefore preferable. From this point of view, it is preferable to perform the grinding such that the above-described average particle size $D_{50}\alpha$ is more preferably 3.9 μm or less and even more preferably 3.8 μm or less. On the other hand, setting the above-described average particle size $D_{50}\alpha$ at 1.0 μm or greater has the advantage of making it possible to suppress an increase in the viscosity of the slurry during wet grinding. From this point of view, the above-described average particle size $D_{50}\alpha$ is preferably 1.2 μm or greater and more preferably 1.3 μm or greater. The average particle size $D_{50}\alpha$ of particles after mixing treatment is the average particle size prior to the ultrasonication and can be determined by laser diffraction/scattering particle size distribution analysis, and specifically by using a method that will be described later (the same applies to $D_{50}\alpha$ after grinding in Step 3 below). The average particle size $D_{50}\alpha$ of particles after mixing treatment can be controlled by adjusting the size of the grinding medium, the grinding time or the number of grinding passes, and the like. Examples of the material of the grinding medium include zirconia, alumina, silicon nitride, silicon carbide, tungsten carbide, wear-resistant steel and stainless steel, and the like. Zirconia may be stabilized by adding a metal oxide. The grinding may be effected either in a single stage or in two or more stages.

Moreover, in the case where the grinding is effected by performing wet grinding, in order to obtain the film-forming powder of the present invention, it is necessary to dry the slurry that is obtained as a result of the wet grinding. Preferably, the drying temperature is from 100 to 200° C.

Note that the dry product may be slightly crushed through a dry process.

Step 2

In Step 2, the ground mixture obtained in Step 1 is fired. With regard to the firing atmosphere, an oxygen-containing atmosphere, such as the atmosphere, or an inert atmosphere, such as argon or nitrogen, may be used. From the standpoint of generating sufficient $YO_XF_Y$, an oxygen-containing atmosphere is preferable. The firing temperature is preferably from 500 to 1400° C. Performing the firing within this temperature range allows sufficient $YO_XF_Y$ to be generated. The firing temperature is more preferably from 600 to 1300° C. and even more preferably from 700 to 1200° C.

Provided that the firing temperature is within the above-described range, the firing time is preferably from 1 to 48 hours, more preferably from 3 to 36 hours, and even more preferably from 6 to 24 hours. Within this firing time range, sufficient $YO_XF_Y$ of a rare earth element is generated, and also energy consumption is suppressed.

Step 3

As is the case with the grinding in Step 1, the grinding in Step 3 may be effected by performing dry grinding, wet grinding, or both dry grinding and wet grinding. Moreover, the same grinding apparatuses and grinding media as those listed in the description of Step 1 may be used as the grinding apparatuses and the grinding media that can be used for dry grinding and wet grinding, respectively. Moreover, in the case where the grinding in this step is effected by performing wet grinding, the same dispersion media as those described in Step 1 can be used as the dispersion medium. However, in this step, unlike Step 1, use of water instead of an organic solvent has no problem in achieving the effects of the present invention. In this step, the grinding is performed such that the average particle size $D_{50}\alpha$ of particles after grinding is preferably from 0.1 to 10 μm and more preferably from 0.3 to 8 μm. Grinding the fired product to an average particle size $D_{50}\alpha$ within this range enables a dense film to be obtained, and is therefore preferable. Note that in the case of wet grinding, the slurry after grinding is dried to give powder. In the case where water is used as the dispersion medium, the slurry may be dried in a state in which the dispersion medium is water, but it is preferable to dry the slurry after converting the dispersion medium to an organic solvent, because in this case agglomeration after drying is easily prevented. Examples of the organic solvent in this case include alcohols such as methanol, ethanol, 1-propanol, and 2-propanol as well as acetones. With regard to the drying temperature, the same description as that of the drying temperature for the drying in Step 1 applies.

A film-forming material in powder form can be obtained in the above-described manner.

(2) Method for Producing Film-Forming Material in Granular Form

The following method may be used as a preferred method for producing a film-forming material in granular form:

Step 1: The same procedure as in Step 1 of the above-described method for producing a film-forming material in powder form is performed.

Step 2: The same procedure as in Step 2 of the above-described method for producing a film-forming material in powder form is performed.

Step 3: The fired product obtained in Step 2 is ground, and the ground fired product is mixed with a solvent to give a slurry.

Step 4: The slurry obtained in Step 3 is granulated using a spray dryer to give a granulated product.

Step 5: The granulated product obtained in Step 4 is fired to give granules containing $YO_XF_Y$ and $YF_3$.

Steps 1 and 2

As described above, these steps are the same as those of the above-described method for producing a film-forming material in powder form.

Step 3

In this step, the fired product obtained in Step 2 is ground, and the ground fired product is mixed with a solvent to give a slurry. In the grinding process of this step, as is the case with the grinding in Step 1 described above with respect to the method for producing a film-forming material in powder form, dry grinding, wet grinding, or both dry grinding and wet grinding may be performed. Moreover, the same grinding apparatuses and grinding media as those listed in the description of that Step 1 may be used as the grinding apparatuses and the grinding media that can be used in dry grinding and wet grinding, respectively. In this step, the grinding is performed such that the average particle size $D_{50}\alpha$ of particles after grinding is preferably from 0.1 to 3.0 µm and more preferably from 0.3 to 2.0 µm. Grinding the fired product to an average particle size $D_{50}\alpha$ within this range enables a dense film to be obtained, and is therefore preferable. Moreover, in the case where the grinding is effected by performing wet grinding, the same dispersion media as those described in Step 1 may be used as the dispersion medium. In this step, unlike Step 1, use of water instead of an organic solvent has no problem in achieving the effects of the present invention. In this step, in the case where wet grinding is directly performed without performing dry grinding or wet grinding is performed after dry grinding, the above-described processing for "grinding the fired product" and processing for "mixing the ground fired product with a solvent to give a slurry" can be simultaneously performed. From the standpoint of successfully obtaining a granulated product by the spray dryer process, which is to be performed subsequent to this step, the concentration of the ground product in the slurry is preferably from 100 to 2000 g/L and more preferably from 200 to 1500 g/L. Setting this concentration in the slurry within this range makes it possible to suppress excessive energy consumption and to form a slurry having an appropriate viscosity, thereby enabling stable spraying.

Step 4

In this step, the slurry obtained in Step 3 is granulated using a spray dryer. Preferably, during operation of the spray dryer, the atomizer rotational speed is from 5000 to 30000 $min^{-1}$. Setting the rotational speed at 5000 $min^{-1}$ or more enables $YO_XF_Y$ and $YF_3$ to be sufficiently dispersed in the slurry, thereby making it possible to obtain a uniform granulated product. On the other hand, setting the rotational speed at 30000 $min^{-1}$ or less making it easy to obtain granules having a target particle size. From these points of view, the atomizer rotational speed is more preferably from 6000 to 25000 $min^{-1}$.

Preferably, during operation of the spray dryer, the inlet temperature is from 120 to 300° C. Setting the inlet temperature at 120° C. or more allows the solvent to be rapidly dried, and therefore has the advantage of creating a sharp particle size distribution of the granules. On the other hand, setting the inlet temperature at 300° C. or less has the advantage of enabling suppression of the generation of fine powder.

Step 5

In this step, the granulated product obtained in Step 4 is fired to give granulated granules containing $YO_XF_Y$ and $YF_3$. With regard to the firing atmosphere, an oxygen-containing atmosphere, such as the atmosphere, an inert atmosphere, such as argon or nitrogen, or a vacuum atmosphere may be used, and among these, an oxygen-containing atmosphere is preferable. From the standpoint of obtaining granules having appropriate granule strength and flowability, it is preferable that the firing temperature is from 250 to 1000° C. From this point of view, it is more preferable that the firing temperature is from 300 to 1000° C. Provided that the firing temperature is within the above-described range, the firing time is preferably from 1 to 48 hours and more preferably from 3 to 24 hours.

Granules containing $YO_XF_Y$ and $YF_3$ are obtained in the above-described manner.

(3) Method for Producing Film-Forming Material in Slurry Form

For example, the following two methods are conceivable as a preferred method for producing a film-forming material in slurry form: (A) a film-forming material in powder form is mixed with a dispersion medium; and (B) in the case where the grinding in Step 3 of the method for producing a film-forming material in powder form is effected by performing wet grinding, the slurry after wet grinding is directly used as a slurry without being dried. In the method (A), the powder may also be slightly crushed during mixing of the powder with the dispersion medium.

(4) Method for Producing Film-Forming Material in Shaped Form

An example of a preferred method for producing a film-forming material in shaped form is a method in which a film-forming material in powder form or granular form is press-formed as it is, or after being mixed with an organic binder and/or water or the like as necessary. The press-forming may be performed using a process such as die pressing, rubber pressing (hydrostatic pressing), sheet forming, extrusion molding, cast molding, or the like. The pressure that is applied in this case is preferably from 30 to 500 MPa and more preferably from 50 to 300 MPa. Examples of the organic binder include PVA (polyvinyl alcohol), acryl, methyl cellulose, and the like.

(5) Method for Producing Film-Forming Material in Sintered Form

For example, the following two methods are conceivable as a preferred method for producing a film-forming material in sintered form: (a) a film-forming material in powder form or granular form is press-formed as it is, or after being mixed with an organic binder, such as PVA (polyvinyl alcohol), acryl, or methyl cellulose, and/or water or the like as necessary, and then the press-formed product is sintered by firing; and (b) a film-forming material in powder form or granular form is sintered by firing while applying a pressure using a hot press (HP) or the like. The firing in the method (a) is usually performed in a non-pressurized state. It is most preferable that the raw material powder subjected to the firing does not contain an organic binder; however, in the case where the raw material powder contains an organic binder, the organic binder content is preferably from 5 parts by mass or less and more preferably 2 parts by mass or less with respect to 100 parts by mass of the film-forming material in powder form or granular form. In the method (a), the same press-forming methods as those for the production of a film-forming material in shaped form may be used, and a preferred pressure is the same as the preferred pressure for production of a film-forming material in shaped form. In the method (b), the pressure sintering may be performed using a hot press, pulsed electric-current pressure sintering (SPS), hot isostatic pressing (HIP), or the like. The pressure that is applied in this case is preferably from 30 to 500 MPa and more preferably from 50 to 300 MPa. In both of the methods (a) and (b), the firing temperature is preferably from 700 to 1800° C. and more preferably from 800 to 1700° C. With regard to the firing atmosphere, an inert gas atmosphere, such as an argon gas, is preferably used so as to prevent decomposition of the oxyfluoride of a rare earth element into an oxide of the rare earth element.

(6) Method for Producing Film-Forming Material in Cluster Form

The following method may be used as a preferred method for producing a film-forming material in cluster form:

Step 1: The same procedure as in Step 1 of the above-described method for producing a film-forming material in powder form is performed.

Step 2: The same procedure as in Step 2 of the above-described method for producing a film-forming material in powder form is performed.

Step 3: The fired product obtained in Step 2 is ground to give a film-forming material in cluster form. Coarse grinding is usually effected by performing dry grinding. Examples of the grinder in this case include various types of crushers such as a jaw crusher, a Masscolloider, and a mortar machine.

Film-forming materials in various forms that are obtained in the above-described manners are advantageously used for the above-described various film formation methods. Examples of a substrate on which a film is to be formed include various metals, such as aluminum, various alloys, such as aluminum alloys, various ceramics, such as alumina, and quartz.

EXAMPLES

Hereinafter, the present invention will be described in greater detail using examples. However, the scope of the present invention is not limited to the examples below. In the following description, "%" means "mass %" unless otherwise specified.

Example 1

Step 1: Mixing of Raw Materials

First, 100 mol of yttrium oxide $Y_2O_3$ powder ($D_{50d}$=3.2 μm) manufactured by Nippon Yttrium Co., Ltd. and 200 mol of yttrium fluoride $YF_3$ powder ($D_{50d}$=5.6 μm) manufactured by Nippon Yttrium Co., Ltd. were mixed, and ethanol serving as a solvent for mixing was added to the mixed powder to give a slurry having a solid concentration of 50%. This slurry was subjected to wet grinding using a DYNO-MILL ECM-AP2 (wet bead mill) from Willy A. Bachofen such that $D_{50}\alpha$ of particles after mixing treatment, as determined on a Microtrac (registered trademark) HRA using a method below, was 3 μm or less (specifically, 2.5 μm). The slurry after the wet grinding was dried at 120° C. for 12 hours to give a dry product.

Method for Determining $D_{50}\alpha$

About 1 g of ground powder was put in a 100-mL glass beaker, and a 0.2% aqueous solution of sodium hexametaphosphate serving as a dispersion medium was then put in the beaker to the line of 100 mL to prepare a slurry for determination. The slurry for determination was dropped into a chamber, containing a 0.2% aqueous solution of sodium hexametaphosphate, of a sample circulator of a Microtrac (registered trademark) HRA manufactured by Nikkiso Co., Ltd. until the instrument judged the concentration to be adequate, and $D_{50}\alpha$ was determined.

Step 2: Firing

The dry product obtained in Step 1 was placed in a container made of alumina, and fired at 900° C. for 12 hours in the atmosphere to give a fired product.

Step 3: Grinding

The fired product obtained in Step 2 was placed in the DYNO-MILL ECM-AP2 together with pure water and subjected to wet grinding. The grinding was performed such that $D_{50}\alpha$ as determined using the Microtrac (registered trademark) HRA was from 0.5 to 1.5 μm. After the grinding, the concentration was adjusted by further adding pure water to give a slurry having a concentration of 500 g/L.

Step 4: Granulation

The slurry obtained in Step 3 was granulated and dried using a spray dryer (manufactured by Ohkawara Kakohki Co., Ltd.) to give a granulated product. The operating conditions of the spray dryer were as follows:

Slurry feed rate: 300 mL/min

Atomizer rotational speed: 9000 min$^{-1}$

Inlet temperature: 250° C.

Step 5: Firing of Granulated Product

The granulated product obtained in Step 4 was placed in a container made of alumina, and fired in an electric oven in the atmosphere to give granulated granules. The firing temperature was 750° C., and the firing time was 12 hours. Thus, a target film-forming material in granular form was obtained.

The average particle size $D_{50}$ of this film-forming material was obtained using a method below. Moreover, powder X-ray diffractometry was performed as X-ray diffractometry in the following manner.

From the resultant chart, the intensities (unit: cps) of the maximum peaks of $Y_5O_4F_7$, YOF, and $Y_2O_3$ and the intensity (unit: cps) of the (020) plane of $YF_3$ observed at 2θ=26.03 degrees were obtained. Then, the relative intensities of the maximum peaks of YOF and $Y_2O_3$ as well as the peak of the (020) plane of $YF_3$ observed at 2θ=26.03 degrees with respect to the intensity 100 of the maximum peak (main peak) of $Y_5O_4F_7$ were obtained. Also, the oxygen content in the film-forming material was obtained using the above-described method.

X-ray Diffractometry

Apparatus: Ultima IV (manufactured by Rigaku Corporation)

Radiation source: CuKα radiation

Tube voltage: 40 kV

Tube current: 40 mA

Scan rate: 2°/min

Step: 0.02 degrees

Scan range: 2θ=10 to 90 degrees

Method for Determining $D_{50}$

About 1 g of film-forming material was put in a 100-mL glass beaker, and a 0.2% aqueous solution of sodium hexametaphosphate serving as a dispersion medium was then put in the beaker to the line of 100 mL to prepare a slurry for determination. The slurry for determination was dropped into a chamber, containing a 0.2% aqueous solution of sodium hexametaphosphate, of a sample circulator of a Microtrac (registered trademark) HRA manufactured by Nikkiso Co., Ltd. until the instrument judged the concentration to be adequate, and $D_{50}$ was determined.

Furthermore, with the obtained film-forming material, a film was formed using a method described in Formation of Film 1 below.

Formation of Film 1: Plasma Spraying (Film-Forming Material in Granular Form)

A 100 mm square aluminum alloy plate was used as a substrate. Plasma spraying onto the surface of this substrate was performed. A TWIN-SYSTEM 10-V manufactured by Plasma-Technik AG was used as a feeder of the film-forming material. An F4 manufactured by Sulzer Metco AG was used as a plasma sprayer. The plasma spraying was performed to a film thickness of 150 to 200 μm, under the following conditions: agitating rotational speed, 50%; carrier gas flow rate, 2.5 L/min; feed scale, 10%; plasma gas, Ar/H₂; output, 35 kW; and apparatus-substrate spacing, 150 mm. Thus, a thermal-sprayed film was obtained. In Table 2 below, plasma spraying is denoted by "PS".

Example 2

A film-forming material in granular form was obtained in the same manner as in Example 1 except that, in Step 1, the DYNO-MILL ECM-AP2 was replaced by a wet ball mill, and wet grinding was performed such that $D_{50}\alpha$ after mixing treatment as determined on the Microtrac HRA using the above-described method was 2.4 μm. With respect to the obtained film-forming material, $D_{50}$, the relative intensities of the X-ray diffraction peaks, and the oxygen content were determined in the same manner as in Example 1. Table 2 shows the results. Also, a film was formed from the obtained film-forming material in the same manner as in Example 1.

Example 3

A film-forming material in granular form was obtained in the same manner as in Example 1 except that, in Step 1, instead of ethanol, 1-propanol was used as the solvent for mixing. With respect to the obtained film-forming material, $D_{50}$, the relative intensities of the X-ray diffraction peaks, and the oxygen content were determined in the same manner as in Example 1. Table 2 shows the results. Also, a film was formed from the obtained film-forming material in the same manner as in Example 1.

Example 4

In Step 1, dry grinding of the mixed powder was performed using, instead of the wet bead mill, a dry bead mill (DRYSTAR (registered trademark) SDA-5 manufactured by Ashizawa Finetech Ltd.) such that $D_{50}\alpha$ after mixing treatment as determined on the Microtrac HRA using the above-described method was 2.3 μm. Otherwise, the same procedure as in Example 1 was performed to obtain a film-forming material in granular form. With respect to the obtained film-forming material, $D_{50}$, the relative intensities of the X-ray diffraction peaks, and the oxygen content were determined in the same manner as in Example 1. Table 2 shows the results. Also, a film was formed from the obtained film-forming material in the same manner as in Example 1.

Examples 5 to 8

In Step 1, the amount of YF₃ powder was changed to the respective amounts shown in Table 1, and the grinding was performed such that the values of $D_{50}\alpha$ after mixing treatment were as respectively shown in Table 1 below. Moreover, in Example 6, a wet ball mill was used instead of the DYNO-MILL ECM-AP2. In Example 7, the solvent for mixing in Step 1 was changed to that shown in Table 1. In Example 8, dry grinding was performed using a dry bead mill (DRYSTAR (registered trademark) SDA-5 manufactured by Ashizawa Finetech Ltd.) instead of the wet bead mill. Otherwise, the same procedure as in Example 1 was performed, and thus, film-forming materials in granular form were obtained. With respect to each of the obtained film-forming materials, $D_{50}$, the relative intensities of the X-ray diffraction peaks, and the oxygen content were determined in the same manner as in Example 1. Table 2 shows the results. Moreover, a film was formed from each of the obtained film-forming materials in the same manner as in Example 1. The FIGURE shows an X-ray diffraction chart that was obtained with respect to the film-forming material of Example 5. It was confirmed from this chart that the film-forming material contained $Y_5O_4F_7$ and $YF_3$.

Example 9

A film-forming material in granular form was obtained in the same manner as in Example 1 except that $D_{50}\alpha$ after mixing treatment in Step 1 was 3.4 μm, and the firing temperature in Step 2 was 930° C. With respect to the obtained film-forming material, $D_{50}$, the relative intensities of the X-ray diffraction peaks, and the oxygen content were determined in the same manner as in Example 1. Table 2 shows the results. Also, a film was formed from the obtained film-forming material in the same manner as in Example 1.

Comparative Example 1

A film-forming material in granular form was obtained in the same manner as in Example 1 except that the amount of YF₃ powder used was changed to the amount shown in Table 1. With respect to the obtained film-forming material, $D_{50}$, the relative intensities of the X-ray diffraction peaks, and the oxygen content were determined in the same manner as in Example 1. Table 2 shows the results. Also, a film was formed from the obtained film-forming material in the same manner as in Example 1.

Comparative Example 2

In Step 1, YF₃ powder and $Y_2O_3$ powder were put in a polyethylene bag and shaken by hand, without being ground, and the resultant mixture was subjected to Step 2. Otherwise, the same procedure as in Example 1 was performed, and thus, a film-forming material in granular form was obtained. With respect to the obtained film-forming material, $D_{50}$, the relative intensities of the X-ray diffraction peaks, and the oxygen content were determined in the same manner as in Example 1. Table 2 shows the results. Also, a film was formed from the obtained film-forming material in the same manner as in Example 1.

Example 10

Step 1: Mixing of Raw Materials

A dry product was obtained in the same manner as in Step 1 of Example 1 except that the amount of YF₃ powder used was changed to the amount shown in Table 1.

Step 2: Firing

The dry product obtained in Step 1 was placed in a container made of alumina, and fired at 900° C. for 16 hours in the atmosphere to give a fired product.

Step 3: Grinding

The fired product obtained in Step 2 was placed in a DYNO-MILL ECM-AP2 together with pure water and subjected to wet grinding. The grinding was performed such that $D_{50}\alpha$ as determined using a Microtrac (registered trademark) HRA was 3 μm (the powder particle size of the example was 3 μm). After the grinding, the concentration was adjusted by further adding pure water to give a slurry having a concentration of 500 g/L.

The obtained slurry was dried at 120° C. for 24 hours, and thus, a film-forming material in powder form was obtained. With respect to the obtained film-forming material, $D_{50}$, the relative intensities of the X-ray diffraction peaks, and the oxygen content were determined in the same manner as in Example 1. Table 2 shows the results.

Moreover, with the obtained film-forming material, a thermal-sprayed film was formed by performing plasma spraying under the following conditions. A 100 mm square aluminum alloy plate was used as the substrate. A TPP-5000 manufactured by Kyuyor-Giken Co., Ltd. was used as the feeder of the film-forming material. A 100HE manufactured by Progressive Surface was used as the plasma sprayer. The plasma spraying was performed to a film thickness of 150 to 200 μm, under the following conditions: argon gas flow rate, 84.6 L/min; nitrogen gas flow rate, 56.6 L/min; hydrogen gas flow rate, 56.6 L/min; output, 105 kW; apparatus-substrate spacing, 70 mm; and powder feed rate, about 10 g/min.

Example 11

Step 1: Mixing of Raw Materials

A dry product was obtained in the same manner as in Step 1 of Example 1 except that the amount of $YF_3$ powder used was changed to the amount shown in Table 1.

Step 2: Firing

The dry product obtained in Step 1 was placed in a container made of alumina, and fired at 900° C. for 16 hours in the atmosphere to give a fired product.

Step 3: Grinding

The fired product obtained in Step 2 was placed in a DYNO-MILL ECM-AP2 together with pure water and subjected to wet grinding. The grinding was performed such that $D_{50}\alpha$ as determined using a Microtrac (registered trademark) HRA was 3 μm. After the grinding, the concentration was adjusted by further adding ethanol as a dispersion medium, and thus, a film-forming material in slurry form containing 35 mass % powder containing $YO_XF_Y$ and $YF_3$ was obtained. With respect to the obtained film-forming material, $D_{50}$, the relative intensities of the X-ray diffraction peaks, and the oxygen content were determined in the same manner as in Example 1. Table 2 shows the results. Note that, at this time, a dry product obtained by drying the slurry at 120° C. for 24 hours was used to determine the relative intensities of the X-ray diffraction peaks of $Y_5O_4F_7$, $YF_3$, YOF, and $Y_2O_3$ as well as the oxygen content.

Moreover, with the obtained film-forming material, a thermal-sprayed film was obtained by performing plasma spraying. In the plasma spraying, a LiquidfeederHE manufactured by Progressive Surface was used as the feeder. The plasma spraying was performed to a film thickness of 150 to 200 μm, under the following conditions: slurry feed rate, 36 ml/min; argon gas flow rate, 84.6 L/min; nitrogen gas flow rate, 56.6 L/min; hydrogen gas flow rate, 56.6 L/min: output, 105 kW; and apparatus-substrate spacing, 70 mm.

Example 12

A film-forming material in powder form was obtained in the same manner as in Example 10. With respect to the obtained film-forming material, $D_{50}$, the relative intensities of the X-ray diffraction peaks, and the oxygen content were determined in the same manner as in Example 1. Table 2 shows the results. Also, with the obtained film-forming material, a film was formed using a method described in Formation of Film 2: Aerosol Deposition Method (AD Method) below.

Formation of Film 2: Aerosol Deposition Method (AD Method)

A 100 mm square aluminum alloy plate was used as a substrate. A film was formed on the surface of this substrate using the aerosol deposition method.

The film formation was performed to a film thickness of 10 μm, under the following conditions: argon gas flow rate, 5 L/min; aerosolization chamber vibration exciter frequency, 30 Hz; aerosolization chamber vibration exciter amplitude, 1 mm; aerosolization chamber pressure, 40 kPa; and film formation chamber pressure, 100 Pa.

In Table 2, the aerosol deposition method is denoted by "AD".

Example 13

A film-forming material in powder form was obtained in the same manner as in Example 10. With respect to the obtained film-forming material, $D_{50}$, the relative intensities of the X-ray diffraction peaks, and the oxygen content were determined in the same manner as in Example 1. Table 2 shows the results. Also, with the obtained film-forming material, a film was formed using a method described in Formation of Film 3: Ion Plating Method below.

Formation of Film 3: Ion Plating Method

A 100 mm square aluminum alloy plate was used as a substrate. A film was formed on the surface of this substrate using a high-frequency excited ion plating method.

The film formation was performed to a film thickness of 10 μm, under the following conditions: argon gas pressure, 0.02 Pa; EB output, 0.6 kW; RF output, 1 kW; DC acceleration voltage, 1.5 kV; and substrate-evaporation source spacing, 300 mm.

In Table 2, the ion plating method is denoted by "IP".

Example 14

A film-forming material in granular form was obtained in the same manner as in Example 1 except that, in Step 1, the amounts of $Y_2O_3$ powder and $YF_3$ powder used were changed to the respective amounts shown in Table 1. With respect to the obtained film-forming material, $D_{50}$, the relative intensities of the X-ray diffraction peaks, and the oxygen content were determined in the same manner as in Example 1. Table 2 shows the results. Furthermore, with the obtained film-forming material, a film was formed using the method described in Formation of Film 1.

Comparative Example 3

A film-forming material in granular form was obtained in the same manner as in Example 1 except that only $YF_3$ powder in an amount shown in Table 1 was used as the raw material. With respect to the obtained film-forming material, $D_{50}$, the relative intensities of X-ray diffraction peaks, and the oxygen content were determined in the same manner as in Example 1. Table 2 shows the results. Furthermore, with the obtained film-forming material, a film was formed using the method described in Formation of Film 1.

Example 15

A film-forming material in granular form was obtained in the same manner as in Example 1 except that, in Step 1, the amounts of $Y_2O_3$ powder and $YF_3$ powder used were changed to the respective amounts shown in Table 1. With respect to the obtained film-forming material, $D_{50}$, the relative intensities of X-ray diffraction peaks, and the oxygen content were determined in the same manner as in Example 1. Table 2 shows the results.

Furthermore, with the obtained film-forming material, a film was formed using the method described in Formation of Film 1.

Example 16

In Steps 1 and 2, the same processing as in Example 1 was performed to obtain a fired product. The fired product obtained in Step 2 was placed in a DYNO-MILL ECM-AP2 together with pure water and subjected to wet grinding. The grinding was performed such that $D_{50}\alpha$ as determined using a Microtrac (registered trademark) HRA was 3.0 μm. The slurry after the wet grinding was dried at 120° C. for 24 hours, and thus, a film-forming material in powder form was obtained. With respect to the obtained film-forming material, $D_{50}$, the relative intensities of X-ray diffraction peaks, and the oxygen content were determined in the same manner as in Example 1. Table 2 shows the results. With the obtained film-forming material, a film was formed using the method described in Formation of Film 2: Aerosol Deposition Method.

Example 17

With the film-forming material obtained in Example 16, a film was formed using the method described in Formation of Film 3: Ion Plating Method.

Example 18

With the film-forming material obtained in Example 5, a film was formed using the method described in Formation of Film 2: Aerosol Deposition Method.

Example 19

With the film-forming material obtained in Example 5, a film was formed using the method described in Formation of Film 3: Ion Plating Method.

Example 20

In Steps 1 to 4, the same processing as in Example 5 was performed to obtain a granulated product. A pressure of 98 MPa was applied to the obtained granulated product in a 50-mm-diameter mold using a briquetting press BRE-53 manufactured by Maekawa Testing Machine MFG. Co., Ltd., and thus, a film-forming material in shaped form was obtained. A part of the obtained film-forming material was ground, and the relative intensities of X-ray diffraction peaks and the oxygen content were determined in the same manner as in Example 1. Table 2 shows the results. With the obtained film-forming material, a film was formed using the method described in Formation of Film 3: Ion Plating Method.

Example 21

A shaped body obtained in the same manner as in Example 20 was fired at 1650° C. for 10 hours in an argon atmosphere to give a film-forming material in sintered form. A part of the obtained film-forming material was ground, and the relative intensities of X-ray diffraction peaks and the oxygen content were determined in the same manner as in Example 1. Table 2 shows the results. With the obtained film-forming material, a film was formed using the method described in Formation of Film 3: Ion Plating Method.

Example 22

In Steps 1 and 2, the same processing as in Example 5 was performed, and thus, a fired product was obtained. The obtained fired product was subjected to dry grinding using a jaw crusher to give a film-forming material in cluster form with a maximum length from 0.1 to 5 mm. A part of the obtained film-forming material was ground, and the relative intensities of X-ray diffraction peaks and the oxygen content were determined in the same manner as in Example 1. Table 2 shows the results. With the obtained film-forming material, a film was formed using the method described in Formation of Film 3: Ion Plating Method.

Evaluation of Films (1) Porosity

The porosity of each of the films obtained in the examples and comparative examples was determined using a method below, and taken as an indicator of the density of the respective film. Each obtained film was cut into 2 cm square using a wet diamond cutter. The cut sample was embedded in an epoxy resin, and the cut surface was polished using a diamond slurry. The porosity (vol %) was analyzed by image analysis of an optical microscopic image. It can be judged that the smaller the porosity, the higher the film density. Table 2 shows the results.

(2) Corrosion Resistance Against Halogen-Based Plasma

With respect to each of the films obtained in the examples and comparative examples above, the corrosion resistance against halogen-based plasma was examined using a method below. Table 2 shows the results.

Method for Evaluating the Number of Particles Generated

Plasma etching was performed on the film formed on each 100 mm square aluminum alloy plate using the above-described film formation method. During the plasma etching, a silicon wafer having a diameter of 3 inches was placed in the chamber. Among particles that were scraped off and scattered by the etching effect and deposited on the surface of the silicon wafer, the number of particles with a particle size of about 0.2 μm or greater was measured using a magnifier. The plasma etching was performed using fluorine-based plasma under the following conditions:

Atmospheric gas: $CHF_3$:Ar:$O_2$=80:160:100 mL/min

High-frequency electric power: 1300 W

Pressure: 4 Pa

Temperature: 60° C.

Etching time: 70 hours

Also, the same measurement was performed using chlorine-based plasma by changing $CHF_3$ of the atmospheric gas to HCl.

TABLE 1

| | Conditions of mixing treatment in Step 1 | | | | | | Firing |
| | Amounts of raw materials used | | Method for | Apparatus | Solvent | D50α after mixing | temperature in |
| | Y2O3 [mol] | YF3 [mol] | mixing raw materials | used for mixing | for mixing | treatment [μm] | Step 2 [° C.] |
|---|---|---|---|---|---|---|---|
| Ex. 1 | 100 | 200 | Wet grinding | Wet bead mill | Ethanol | 2.5 | 900 |
| Ex. 2 | 100 | 200 | Wet grinding | Wet ball mill | Ethanol | 2.4 | 900 |
| Ex. 3 | 100 | 200 | Wet grinding | Wet bead mill | 1-Propanol | 2.5 | 900 |
| Ex. 4 | 100 | 200 | Dry grinding | Dry bead mill | — | 2.3 | 900 |
| Ex. 5 | 100 | 541 | Wet grinding | Wet bead mill | Ethanol | 2.7 | 900 |
| Ex. 6 | 100 | 541 | Wet grinding | Wet ball mill | Ethanol | 2.4 | 900 |
| Ex. 7 | 100 | 541 | Wet grinding | Wet bead mill | 1-Propanol | 2.9 | 900 |
| Ex. 8 | 100 | 541 | Dry grinding | Dry bead mill | — | 3.1 | 900 |
| Ex. 9 | 100 | 200 | Wet grinding | Wet bead mill | Ethanol | 3.4 | 930 |
| Com. Ex. 1 | 100 | 175 | Wet grinding | Wet bead mill | Ethanol | 2.5 | 900 |
| Com. Ex. 2 | 100 | 200 | Shaking | Polyethylene bag | — | 5.6 | 900 |
| Ex. 10 | 100 | 541 | Wet grinding | Wet bead mill | Ethanol | 2.5 | 900 |
| Ex. 11 | 100 | 541 | Wet grinding | Wet bead mill | Ethanol | 2.5 | 900 |
| Ex. 12 | 100 | 541 | Wet grinding | Wet bead mill | Ethanol | 2.5 | 900 |
| Ex. 13 | 100 | 541 | Wet grinding | Wet bead mill | Ethanol | 2.5 | 900 |
| Ex. 14 | 10 | 500 | Wet grinding | Wet bead mill | Ethanol | 2.5 | 900 |
| Com. Ex. 3 | — | 500 | Wet grinding | Wet bead mill | Ethanol | 2.5 | 900 |
| Ex. 15 | 5 | 500 | Wet grinding | Wet bead mill | Ethanol | 2.5 | 900 |
| Ex. 16 | 100 | 200 | Wet grinding | Wet bead mill | Ethanol | 2.5 | 900 |
| Ex. 17 | 100 | 200 | Wet grinding | Wet bead mill | Ethanol | 2.5 | 900 |
| Ex. 18 | 100 | 541 | Wet grinding | Wet bead mill | Ethanol | 2.7 | 900 |
| Ex. 19 | 100 | 541 | Wet grinding | Wet bead mill | Ethanol | 2.7 | 900 |
| Ex. 20 | 100 | 541 | Wet grinding | Wet bead mill | Ethanol | 2.7 | 900 |
| Ex. 21 | 100 | 541 | Wet grinding | Wet bead mill | Ethanol | 2.7 | 900 |
| Ex. 22 | 100 | 541 | Wet grinding | Wet bead mill | Ethanol | 2.7 | 900 |

TABLE 2

| | Powder characteristics | | | | | | | |
| | | | Relative intensities of X-ray diffraction peaks | | | | | |
| | Form | D50 [μm] | YOxFy ($I_1$) X = 0.8, Y = 1.4 | YF3 ($I_2$) | YOF ($I_3$) | Y2O3 ($I_4$) | $I_2/I_1$ | $I_3/I_1$ |
|---|---|---|---|---|---|---|---|---|
| Ex. 1 | Granules | 45 | 100 | 2 | — | — | 0.02 | — |
| Ex. 2 | Granules | 46 | 100 | 3 | — | — | 0.03 | — |
| Ex. 3 | Granules | 47 | 100 | 1 | — | — | 0.01 | — |
| Ex. 4 | Granules | 53 | 100 | 2 | — | — | 0.02 | — |
| Ex. 5 | Granules | 45 | 100 | 21 | — | — | 0.21 | — |
| Ex. 6 | Granules | 51 | 100 | 23 | — | — | 0.23 | — |
| Ex. 7 | Granules | 49 | 100 | 19 | — | — | 0.19 | — |
| Ex. 8 | Granules | 45 | 100 | 32 | — | — | 0.32 | — |
| Ex. 9 | Granules | 54 | 100 | 30 | 1 | — | 0.3 | 0.01 |
| Com. Ex. 1 | Granules | 52 | 100 | 0 | 1 | 1.2 | 0 | 0.01 |
| Com. Ex. 2 | Granules | 52 | 100 | 0 | 1 | 2.3 | 0 | 0.01 |
| Ex. 10 | Powder | 3 | 100 | 21 | — | — | 0.21 | — |
| Ex. 11 | Slurry | 3 | 100 | 23 | — | — | 0.23 | — |
| Ex. 12 | Powder | 3 | 100 | 22 | — | — | 0.22 | — |
| Ex. 13 | Powder | 3 | 100 | 22 | — | — | 0.22 | — |
| Ex. 14 | Granules | 45 | 100 | 300 | — | — | 3 | — |
| Com. Ex. 3 | Granules | 46 | 100 | 12000 | — | — | 120 | — |
| Ex. 15 | Granules | 46 | 100 | 6000 | — | — | 60 | — |
| Ex. 16 | Powder | 3 | 100 | 2 | — | — | 0.02 | — |
| Ex. 17 | Powder | 3 | 100 | 2 | — | — | 0.02 | — |
| Ex. 18 | Granules | 45 | 100 | 21 | — | — | 0.21 | — |
| Ex. 19 | Granules | 45 | 100 | 21 | — | — | 0.21 | — |
| Ex. 20 | Shaped body | — | 100 | 21 | — | — | 0.21 | — |
| Ex. 21 | Sintered body | — | 100 | 21 | — | — | 0.21 | — |
| Ex. 22 | Clusters | — | 100 | 21 | — | — | 0.21 | — |

TABLE 2-continued

| | Powder characteristics | | | | Film characteristics | | |
|---|---|---|---|---|---|---|---|
| | Relative intensities of X-ray | | Oxygen | Film | | Number of particles generated | |
| | diffraction peaks | | content | formation | Porosity | F-based | Cl-based |
| | $I_3/I_1$ | $I_4/I_1$ | [%] | method | [vol %] | plasma | plasma |
| Ex. 1 | — | — | 9.9 | PS | 9 | 12 | 18 |
| Ex. 2 | — | — | 9.8 | PS | 8 | 13 | 13 |
| Ex. 3 | — | — | 10.1 | PS | 11 | 12 | 14 |
| Ex. 4 | — | — | 9.8 | PS | 12 | 11 | 18 |
| Ex. 5 | — | — | 5.2 | PS | 9 | 2 | 2 |
| Ex. 6 | — | — | 5.4 | PS | 6 | 3 | 1 |
| Ex. 7 | — | — | 5.3 | PS | 9 | 1 | 3 |
| Ex. 8 | — | — | 5.1 | PS | 10 | 3 | 2 |
| Ex. 9 | 0.01 | — | 5.2 | PS | 9 | 4 | 2 |
| Com. Ex. 1 | 0.01 | 0.012 | 12.4 | PS | 12 | 98 | 96 |
| Com. Ex. 2 | 0.01 | 0.023 | 11.9 | PS | 14 | 95 | 96 |
| Ex. 10 | — | — | 5.4 | PS | 3 | 0 | 1 |
| Ex. 11 | — | — | 5.6 | PS | 3 | 1 | 1 |
| Ex. 12 | — | — | 5.7 | AD | <3 | 1 | 1 |
| Ex. 13 | — | — | 5.4 | IP | <3 | 0 | 1 |
| Ex. 14 | — | — | 1.2 | PS | <3 | 2 | 3 |
| Com. Ex. 3 | — | — | 0.5 | PS | <3 | 87 | 65 |
| Ex. 15 | — | — | 0.7 | PS | <3 | 4 | 6 |
| Ex. 16 | — | — | 9.8 | AD | <0.03 | 2 | 3 |
| Ex. 17 | — | — | 9.8 | IP | <0.03 | 1 | 0 |
| Ex. 18 | — | — | 5.2 | AD | <0.03 | 1 | 1 |
| Ex. 19 | — | — | 5.2 | IP | <0.03 | 1 | 0 |
| Ex. 20 | — | — | 5.2 | IP | <0.03 | 2 | 1 |
| Ex. 21 | — | — | 5.2 | IP | <0.03 | 1 | 1 |
| Ex. 22 | — | — | 5.2 | IP | <0.03 | 1 | 1 |

(In Table 2, "—" under the headings "$I_3$" and "$I_4$" indicates that no peak was observed.)

As is clear from the results shown in Table 2, the films obtained by using the film-forming materials of the examples had a low porosity and showed that fewer particles were generated with respect to both of the fluorine- and chlorine-based plasmas. In contrast, the films obtained by using the film-forming materials of the comparative examples showed that a large number of particles were generated with respect to the fluorine- and chlorine-based plasmas. Therefore, it is found that a film having a high corrosion resistance against plasma using a halogen-based gas can be obtained due to the film-forming material of the present invention containing an oxyfluoride of yttrium represented by $YO_xF_y$ and $YF_3$ in a specific ratio.

INDUSTRIAL APPLICABILITY

The film-forming material of the present invention exhibits a high deposition rate during film formation using the film-forming material, and the resultant film has a high corrosion resistance against plasma using a halogen-based gas, namely either a fluorine-based gas or a chlorine-based gas.

The invention claimed is:

1. A film-forming material in powder form comprising:
an yttrium oxyfluoride represented by $YO_{0.8}F_{1.4}$ and $YF_3$,
wherein a ratio $I_2/I_1$ of a peak height $I_2$ of the (020) plane of the $YF_3$ to a height $I_1$ of a main peak of the $YO_{0.8}F_{1.4}$ as analyzed by XRD is from 0.19 to 3,
and the average particle size $D_{50}$ of the film-forming material in powder form is 0.1 µm to 9 µm, and an oxygen content in the film-forming material in powder form is from 0.5 to 11.0 mass %.

2. The film-forming material in powder form according to claim 1, wherein a ratio $I_3/I_1$ of a peak height Is of a main peak of YOF to the peak height $I_1$ of the main peak of the $YO_{0.8}F_{1.4}$ as analyzed by XRD is 0.5 or less.

3. The film-forming material in powder form according to claim 1, wherein a ratio $I_4/I_1$ of a peak height $I_4$ of a main peak of $Y_2O_3$ to the peak height $I_1$ of the main peak of the $YO_{0.8}F_{1.4}$ as analyzed by XRD is 0.01 or less.

4. The film-forming material in powder form according to claim 1, wherein the film-forming material in powder form is used for a thermal spraying method.

5. The film-forming material in powder form according to claim 1, wherein the film-forming material is used for an aerosol deposition method.

6. The film-forming material in powder form according to claim 1, wherein the film-forming material is used for an ion plating method.

7. A method for producing a film, which comprises a step of thermal spraying the film-forming material in powder form according to claim 1.

8. A method for producing a film, which comprises a step of aerosol depositing the film-forming material in powder form according to claim 1.

9. A method for producing a film, which comprises a step of ion plating the film-forming material in powder form according to claim 1.

10. A film-forming material in slurry form which contains the film-forming material in powder form according to claim 1.

11. The film-forming material in slurry form according to claim 10, wherein the film-forming material in slurry form is used for a thermal spraying method.

12. A method for producing a film, which comprises a step of thermal spraying the film-forming material in slurry form according to claim 10.

13. A film-forming material in powder form according to claim 1, which is obtained by firing a mixture obtained by grinding a powder containing $Y_2O_3$ and $YF_3$, and grinding the fired product.

14. The film-forming material in powder form according to claim 1, wherein the average particle size $D_{50}$ of the film-forming material in powder form is 0.1 μm to 8 μm.

* * * * *